United States Patent
Ishibashi

(10) Patent No.: US 10,395,949 B2
(45) Date of Patent: Aug. 27, 2019

(54) SUBSTRATE DRYING APPARATUS, STORAGE MEDIUM, AND SUBSTRATE DRYING METHOD

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 756 days.

(21) Appl. No.: 14/687,758

(22) Filed: Apr. 15, 2015

(65) Prior Publication Data

US 2015/0303078 A1    Oct. 22, 2015

(30) Foreign Application Priority Data

Apr. 16, 2014   (JP) ................................. 2014-084372

(51) Int. Cl.
  *H01L 21/67*   (2006.01)
(52) U.S. Cl.
  CPC .. *H01L 21/67034* (2013.01); *H01L 21/67028* (2013.01); *H01L 21/67253* (2013.01)
(58) Field of Classification Search
  None
  See application file for complete search history.

(56) References Cited

U.S. PATENT DOCUMENTS

| | | | |
|---|---|---|---|
| 2006/0234503 A1 | 10/2006 | Yamada et al. | |
| 2007/0131256 A1* | 6/2007 | Nanba | B08B 3/02 134/33 |
| 2007/0199579 A1 | 8/2007 | Hayasaki et al. | |
| 2008/0057194 A1* | 3/2008 | Tanaka | G03F 7/162 427/240 |
| 2008/0289656 A1 | 11/2008 | Kondoh | |
| 2011/0289795 A1* | 12/2011 | Ishibashi | H01L 21/02074 34/467 |

(Continued)

FOREIGN PATENT DOCUMENTS

| | | |
|---|---|---|
| JP | 2007/220956 A | 8/2007 |
| JP | 2007/529106 A | 10/2007 |
| JP | 2008-294276 A | 12/2008 |

(Continued)

OTHER PUBLICATIONS

Japan Patent Office, Notification of Reasons for Refusal in Japanese Patent Application No. 2014-084372 (dated Nov. 24, 2017).

*Primary Examiner* — Mikhail Kornakov
*Assistant Examiner* — Ryan L. Coleman
(74) *Attorney, Agent, or Firm* — Leydig, Voit and Mayer, Ltd.

(57) ABSTRACT

The substrate drying apparatus includes a rinse agent nozzle configured to eject a rinse agent to the substrate while moving away from a center of the substrate relative to the substrate, a drying gas nozzle configured to spout a drying gas to the substrate while moving away from the center of substrate relative to the substrate with movement of the rinse agent nozzle, a liquid area sensor and a dried area sensor configured to sense a surface of the substrate around an interface of the rinse agent by moving away from the center of the substrate with movement of the rinse agent nozzle and the drying gas nozzle, and a control unit configured to control a drying condition based on the sensing results of the liquid area sensor and the dried area sensor.

15 Claims, 14 Drawing Sheets

(56) References Cited

U.S. PATENT DOCUMENTS

2012/0006361 A1 1/2012 Miyagi et al.
2015/0194301 A1 7/2015 Uemura et al.

FOREIGN PATENT DOCUMENTS

| JP | 2011-171396 A | 9/2011 |
| JP | 2011-192967 A | 9/2011 |
| JP | 2012/019002 A | 1/2012 |
| JP | 2015/133347 A | 7/2015 |

* cited by examiner

SUBSTRATE DRYING APPARATUS, STORAGE MEDIUM, AND SUBSTRATE DRYING METHOD

CROSS-REFERENCE TO RELATED APPLICATIONS

This application claims the benefit of Japanese Patent Application JP 2014-084372 filed on Apr. 16, 2014, the entire contents of which are incorporated herein by reference.

FIELD

The present technology relates to a substrate drying apparatus, a storage medium, and a substrate drying method, and more particularly, a substrate drying apparatus, control program, and a substrate drying method in which a rinse agent is moved to an outer circumference side by centrifugal force and Marangoni force, a dried area on a substrate is gradually spread from a center to an outer circumference, and an entire surface of the substrate is finally dried.

BACKGROUND AND SUMMARY

On the background of the recent demand for size reduction of semiconductor device, copper having small resistance has been used as an wiring material. Commonly, a copper wiring is formed such that a groove is formed in an insulating film formed on a surface of a substrate, the groove is filled with copper, and thereafter extra copper is pruned by Chemical Mechanical Polishing (CMP). The substrate polished by the CMP is cleaned by wet cleaning and then dried. The insulating film filled with copper is formed using a material (a low-k film) having a low k value (relative dielectric constant) in order to reduce capacitance of a capacitor formed between wirings. Since the low-k film is hydrophobic, a water film on a substrate is likely to be divided at the time of cleaning after polishing, and if drying is performed in a state in which a water film is divided, a defect such as a watermark is likely to occur.

Under the circumstances, as a drying method that is effective for defect occurrence suppression, there is a method (hereinafter, referred to "single wafer IPA drying") of single wafer processing in which a liquid flow of a rinse agent for drying is supplied from a rinse agent nozzle to a rotating substrate, a liquid film covering the entire surface of the substrate is formed, a gas flow for drying containing isopropyl alcohol (IPA) reducing a surface tension of the rinse agent is supplied from a drying gas nozzle to the inside of the liquid flow, the rinse agent nozzle and the drying gas nozzle are moved from the center of the rotating substrate toward an outer circumference, the rinse agent is moved to the outer circumference side by centrifugal force and Marangoni force, a dried area on the substrate is gradually spread to the outer circumference, and the entire surface of the substrate is finally dried.

In the single wafer IPA drying, the rinse agent is spread toward the outer circumference of the substrate by the centrifugal force. At the same time, by increasing surface tension of an edge or an interface of the rinse agent (hereinafter referred to as "rinse edge") outward by the Marangoni effect caused by the IPA, the rinse edge is moved toward the outer circumference of the substrate.

However, in the single wafer IPA drying, if a drying condition such as a supply amount of the rinse agent or a moving speed toward the outer circumference of the rinse agent nozzle and the drying gas nozzle is inappropriate for a moving speed of the substrate surface by rotation of the substrate, the single wafer IPA drying is not properly performed, and a defect is caused by a watermark or a residual foreign substance. Particularly, when a substrate has a large diameter, for example, since a difference in a relative moving speed of the substrate surface between at a location near the center and at a location near the outer circumference regarding the rinse agent nozzle and the drying gas nozzle is increased, it is difficult to perform the excellent single wafer IPA drying by moving the rinse edge from the center to the outer circumference while keeping the throughput as high as possible.

It is desired to provide a substrate drying apparatus, a control program, and a substrate drying method, which are capable of suppressing the occurrence of a defect by performing the excellent single wafer IPA drying.

A substrate drying apparatus according to an embodiment includes a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, a sensor configured to sense a surface of the substrate around an rinse edge of the rinse agent by moving away from the center of the substrate with movement of the rinse agent nozzle and the drying gas nozzle, and a control unit configured to control a drying condition based on the sensing result of the sensor such that the rinse edge is spread on the surface of the substrate toward an outer circumference of the substrate by the rinse agent and the drying gas.

A substrate drying apparatus according to another aspect includes a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, a sensor configured to sense a surface of the substrate while moving together with the rinse agent nozzle, and a control unit configured to control a drying condition based on the sensing result of the sensor.

Further, a substrate drying apparatus according to another aspect includes a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, and a control unit configured to control the rinse agent nozzle such that an ejection amount of the rinse agent is increased as the rinse agent nozzle gets away from the center of the substrate.

A substrate drying method according to an embodiment includes rotating a substrate within a horizontal plane, ejecting a rinse agent from a rinse agent nozzle to the substrate while moving the rinse agent nozzle away from a center of the substrate, spouting a drying gas from a drying gas nozzle to the substrate while moving the drying gas nozzle away from the center of substrate with movement of the rinse agent nozzle, sensing a surface of the substrate around an rinse edge of the rinse agent by moving away from the center of the substrate with movement of the rinse agent nozzle and the drying gas nozzle, and controlling a drying condition based on the sensing result such that the rinse edge is spread on the surface of the substrate toward an outer circumference of the substrate by the rinse agent and the drying gas.

A storage medium according to an embodiment stores the following control program in a non-transitory manner; the control program controls a substrate drying apparatus including a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, a sensor configured to sense a surface of the substrate around an rinse edge of the rinse agent by moving away from the center of the substrate with movement of the rinse agent nozzle and the drying gas nozzle, wherein the control program controls a drying condition based on the sensing result of the sensor such that the rinse edge is spread on the surface of the substrate toward an outer circumference of the substrate by the rinse agent and the drying gas.

DETAILED DESCRIPTION OF NON-LIMITING EXAMPLE EMBODIMENTS

Figure 1:
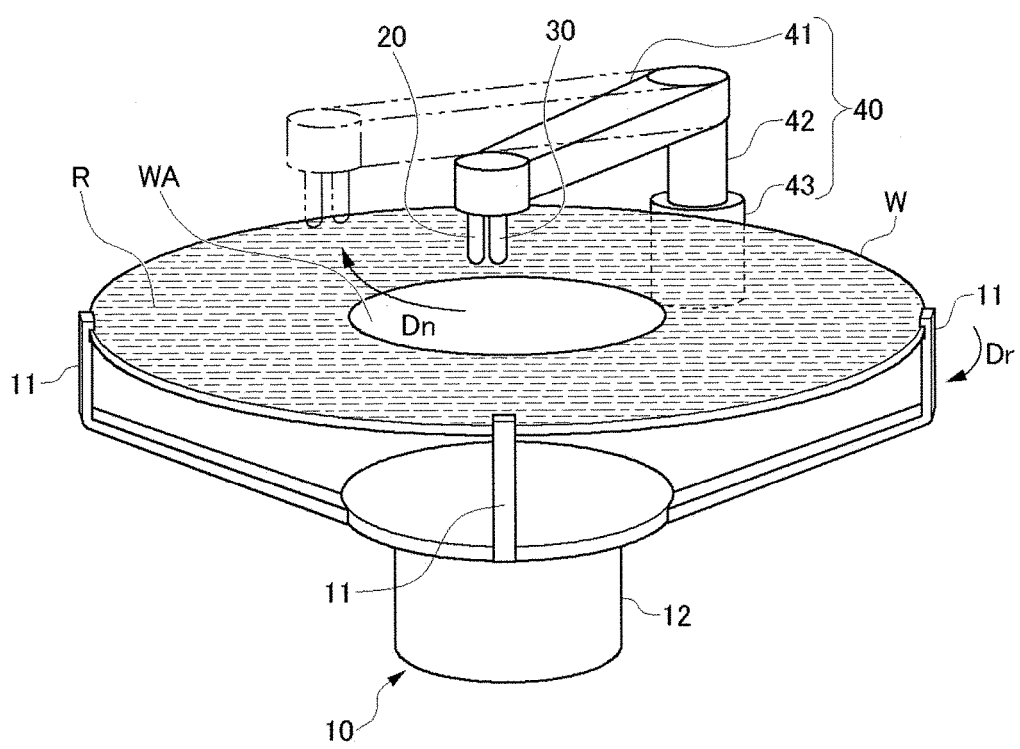
FIG. 1 is a perspective view illustrating a schematic configuration of a substrate drying apparatus according to an embodiment.

Hereinafter, a substrate drying apparatus according to an embodiment will be described. Further, embodiments described below are examples for carrying out the present technology, and the present technology is not limited to a specific configuration described below. A specific configuration according to an embodiment may be appropriately employed when the present technology is carried out.

A substrate drying apparatus according to an embodiment includes a configuration provided with a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, a sensor configured to sense a surface of the substrate around a rinse edge of the rinse agent by moving away from the center of the substrate with movement of the rinse agent nozzle and the drying gas nozzle, and a control unit configured to control a drying condition based on the sensing result of the sensor such that the rinse edge is spread on the surface of the substrate toward an outer circumference of the substrate by the rinse agent and the drying gas.

Through this configuration, it is possible to sense a portion around the rinse edge that is spread toward the outer circumference while moving the sensor and to control the drying condition such that the rinse edge has a desired shape during drying based on the sensing result. Further, regarding the sensor, to move with movement of the rinse agent nozzle and the drying gas nozzle means that the sensor also moves when the rinse agent nozzle and the drying gas nozzle move but does not mean that the sensor necessarily moves together with the rinse agent nozzle and the drying gas nozzle.

In the substrate drying apparatus, the sensor may be a liquid area sensor that senses an outer side of the rinse edge to be formed on the surface of the substrate by the rinse agent and the drying gas. Through this configuration, it is possible to detect a state in which there is no rinse agent in a region that should be outside the rinse edge and to control the drying condition.

In the substrate drying apparatus, the sensor may be a dried area sensor that senses an inner side of the rinse edge to be formed on the surface of the substrate by the rinse agent and the drying gas. Through this configuration, it is possible to detect a state in which there is no rinse agent and a state in which there is a rinse agent in a region that should be inside rinse edge and to control the drying condition.

In the substrate drying apparatus, the sensor may include a liquid area sensor that senses an outer side of the rinse edge to be formed on the surface of the substrate by the rinse agent and the drying gas and a dried area sensor that senses an inner side of the rinse edge to be formed on the surface of the substrate by the rinse agent and the drying gas. Through this configuration, it is possible to detect a state in which there is no rinse agent in a region that should be outside the rinse edge and a state in which there is a rinse agent in a region that should be inside the rinse edge and to control the drying condition.

In the substrate drying apparatus, the liquid area sensor may be moved with movement of the rinse agent nozzle and the drying gas nozzle so that a distance between a gravity center of a water-landing area of the rinse agent ejected from the rinse agent nozzle in the surface of the substrate and the center of the substrate is substantially equal to a distance between an innermost of a sensing area of the liquid area sensor in the surface of the substrate and the center of the substrate. Through this configuration, it is possible to detect a state in which movement of the rinse agent nozzle is slow, or there is a shortage of an ejection amount of the rinse agent and to control the drying condition.

In the substrate drying apparatus, the dried area sensor may be moved with movement of the rinse agent nozzle and the drying gas nozzle so that a distance between an innermost of a water-landing area of the rinse agent ejected from the rinse agent nozzle in the surface of the substrate and the center of the substrate is substantially equal to a distance between a gravity center of a sensing area of the dried area sensor in the surface of the substrate and the center of the substrate. Through this configuration, it is possible to detect a state in which movement of the rinse agent nozzle is fast, or an ejection amount of the rinse agent is excessive and to control the drying condition.

In the substrate drying apparatus, a relative positional relation between the rinse agent nozzle and the liquid area sensor may be fixed. Through this configuration, the liquid area sensor can move, following the movement of the rinse agent nozzle certainly, and can sense a liquid area around the rinse edge.

In the substrate drying apparatus, a relative positional relation between the rinse agent nozzle and the dried area sensor may be fixed. Through this configuration, the dried area sensor can move, following the movement of the rinse agent nozzle certainly, and can sense a dried area around the rinse edge.

In the substrate drying apparatus, the drying condition may include an ejection amount of the rinse agent from the rinse agent nozzle. Through this configuration, it is possible to improve, for example, a situation in which there is a shortage of a rinse agent, and thus the rinse edge is broken while the substrate is being rotated.

In the substrate drying apparatus, the drying condition may include a moving speed of the rinse agent nozzle. Through this configuration, it is possible to improve, for example, a situation in which the moving speed of the rinse agent nozzle is too fast, and thus the rinse agent nozzle overtakes the rinse edge in the outer circumferential direction of the substrate.

In the substrate drying apparatus, the drying condition may include a rotation speed of the substrate. Through this configuration, it is possible to improve, for example, a situation in which the rotation speed of the substrate is too fast, and thus the rinse edge overtakes the rinse agent nozzle in the outer circumferential direction of the substrate.

A substrate drying apparatus according to another embodiment includes a configuration provided with a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, a sensor configured to sense a surface of the substrate while moving together with the rinse agent nozzle, and a control unit configured to control a drying condition based on the sensing result of the sensor.

Through this configuration, since the sensor moving together with the rinse agent nozzle senses the surface of the substrate, it is possible to control the drying condition based on the state of the rinse agent that is spread toward the outer circumference by the rinse agent nozzle and the drying gas nozzle such that the rinse edge has a desired shape during drying.

Further, a substrate drying apparatus according to another embodiment includes a configuration provided with a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, and a control unit configured to control the rinse agent nozzle such that an ejection amount of the rinse agent is increased as the rinse agent nozzle gets away from the center of the substrate.

Through this configuration, since the ejection amount of the rinse agent is increased as it gets away from the center of the substrate, it is possible to form a desired rinse edge even when the speed of the surface of the substrate toward which the rinse agent nozzle ejects the rinse agent is increased.

A substrate drying method includes a configuration rotating a substrate within a horizontal plane, ejecting a rinse agent from a rinse agent nozzle to the substrate while moving the rinse agent nozzle away from a center of the substrate, spouting a drying gas from a drying gas nozzle to the substrate while moving the drying gas nozzle away from the center of substrate with movement of the rinse agent nozzle, sensing a surface of the substrate around a rinse edge of the rinse agent by moving away from the center of the substrate with movement of the rinse agent nozzle and the drying gas nozzle, and controlling a drying condition based on the sensing result such that the rinse edge is spread on the surface of the substrate toward an outer circumference of the substrate by the rinse agent and the drying gas.

Through this configuration, it is possible to sense a portion around the rinse edge that is spread toward the outer circumference and to control the drying condition based on the sensing result such that the rinse edge has a desired shape during drying.

A storage medium according to an embodiment stores a control program in a non-transitory manner; the control program includes a configuration which controls a substrate drying apparatus including a substrate rotating mechanism configured to rotate a substrate within a horizontal plane, a rinse agent nozzle configured to eject a rinse agent to the substrate while moving away from a center of the substrate relative to the substrate rotated by the substrate rotating mechanism, a drying gas nozzle configured to spout a drying gas to the substrate while moving away from the center of substrate relative to the substrate rotated by the substrate rotating mechanism with movement of the rinse agent nozzle, and a sensor configured to sense a surface of the substrate around a rinse edge of the rinse agent by moving away from the center of the substrate with movement of the rinse agent nozzle and the drying gas nozzle, wherein the control program controls a drying condition based on the sensing result of the sensor such that the rinse edge is spread on the surface of the substrate toward an outer circumference of the substrate by the rinse agent and the drying gas.

Through this configuration, it is possible to sense a portion around the rinse edge that is spread toward the outer circumference while moving the sensor and to control the drying condition such that the rinse edge has a desired shape during drying based on the sensing result.

FIG. 1 is a perspective view illustrating a schematic configuration of a substrate drying apparatus 1. First, the substrate drying apparatus 1 according to an embodiment will be described with reference to FIG. 1. The substrate drying apparatus 1 includes a substrate rotating mechanism 10 that rotates a substrate W to be processed, a rinse agent nozzle 20 that supplies a rinse agent R serving as a rinse agent to the substrate W, a drying gas nozzle 30 that supplies drying gas G to the substrate W, a moving mechanism 40 that moves the rinse agent nozzle 20 and the drying gas nozzle 30 parallel with the surface of the substrate W, and a control device 50 that controls an operation of the substrate drying apparatus 1 of the substrate rotating mechanism 10 and the moving mechanism 40. Typically, the substrate W to be processed is a semiconductor substrate serving as a material used to manufacture a semiconductor device, and formed in a circular plate shape. It is usual that a circuit is formed on one surface (this surface is referred to as a "surface WA") of the substrate W, and that no circuit appears on the other surface (rear surface) of the substrate W.

The substrate rotating mechanism 10 includes chuck claws 11 and a rotary drive shaft 12. A plurality of chuck claws 11 are installed to grip an outer circumference end portion (edge portion) of the substrate W and hold the substrate W. The chuck claws 11 are connected to the rotary drive shaft 12 to be able to hold the surface of the substrate W horizontally. In the present embodiment, the substrate W is held by the chuck claws 11 so that the surface WA faces upward. The rotary drive shaft 12 is configured to be able to rotate around an axis line extending vertically to the surface of the substrate W and rotate the substrate W in a substrate rotation direction Dr within a horizontal plane by rotation around the axis line of the rotary drive shaft 12.

The moving mechanism 40 is configured to include a movable arm 41, a movable shaft 42, and a drive source 43. The movable arm 41 has a length larger than the radius of the substrate W. The rinse agent nozzle 20 and the drying gas nozzle 30 are attached to an arm leading edge 41a serving as a leading edge portion of the movable arm 41. The movable shaft 42 is a rod-shaped member that transfers power of the drive source 43 to the movable arm 41, and one end of the movable shaft 42 is connected to an end portion at an opposite side to the arm leading edge 41a of the movable arm 41 so that a longitudinal direction of the movable shaft 42 is orthogonal to a longitudinal direction of the movable arm 41, and the other end of the movable shaft 42 is connected to the drive source 43. The drive source 43 is a device that rotates the movable shaft 42 around the axis line. The movable shaft 42 is installed to extend in a vertical direction outside the substrate W.

The movable arm 41 is configured to cause a drying gas flow Gf ejected from the drying gas nozzle 30 attached to an opposite side to a connection end with the movable shaft 42 to collide with a rotational center of the substrate W. The moving mechanism 40 is configured such that when the drive source 43 is operated, the movable arm 41 rotates through the movable shaft 42, and in accordance with the rotation of the movable arm 41, the rinse agent nozzle 20 and the drying gas nozzle 30 installed at the leading edge 41a move in a direction away from a center Wc of the substrate W toward the outer circumference.

In the present embodiment, the moving mechanism 40 functions as a rinse agent nozzle moving mechanism that moves the rinse agent nozzle 20 relative to the substrate W being rotated by the substrate rotating mechanism 10 above the substrate W to relatively get away from the center of the substrate W and as a drying gas nozzle moving mechanism that moves the drying gas nozzle 30 relative to the substrate W being rotated by the substrate rotating mechanism 10 above the substrate W to relatively get away from the center of the substrate W.

In order to prevent the occurrence of a defect such as a watermark caused as a liquid on the surface WA of the substrate W is dried in a droplet state, the rinse agent nozzle 20 is a nozzle (a tubular device that spouts a fluid through a fine pore of an leading edge) that supplies the rinse agent R for covering the top surface of the substrate W with a liquid film to the substrate W in a liquid flow (rinse agent flow Rf) state.

Typically, the rinse agent R is pure water, but deionized water from which dissolved salts and dissolved organic materials have been removed, carbonated water, functional water (such as hydrogen water or electrolytic ionized water), or the like may be used. It is desirable to use deionized water from a point of view of excluding dissolved salts and dissolved organic materials causing a watermark. Further, since the occurrence of static electricity associated with movement of the rinse agent R onto the substrate W by rotation of the substrate W may induce a foreign substance, it is desirable to use carbonated water from a point of view of increasing conductivity of the rinse agent R and suppressing charging.

The rinse agent flow Rf is fine compared to the area size of the surface WA of the substrate W. The substrate W to be processed has a diameter of 200 mm to 450 mm. An inner diameter of the rinse agent nozzle 20 that will form the rinse agent flow Rf may be appropriately chosen from 1 mm to 10 mm, or 3 mm to 8 mm. A diameter (a cross-sectional diameter of the rinse agent flow Rf) of the rinse agent flow Rf that is ejected from the rinse agent nozzle 20 and collides with the surface WA of the substrate W is substantially the same as the inner diameter of the rinse agent nozzle 20.

Figure 2A:
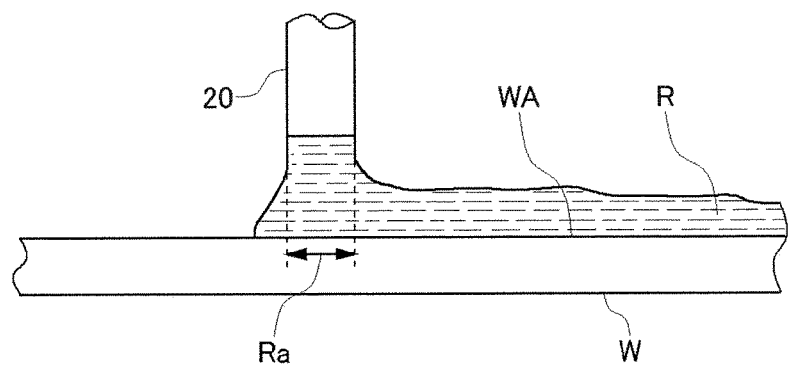
FIG. 2A is a side view of a rinse agent nozzle according to an embodiment.
Figure 2B:
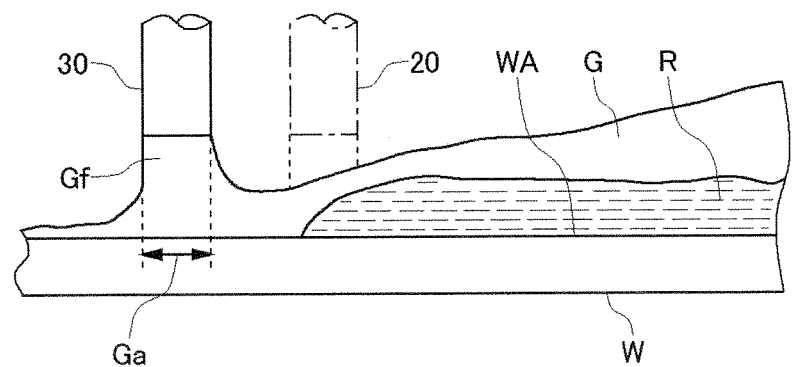
FIG. 2B is a side view of a drying gas nozzle according to an embodiment.

FIGS. 2A and 2B are enlarged side views illustrating a portion around the nozzle leading edge, FIG. 2A is a side view of the rinse agent nozzle, and FIG. 2B is a side view illustrating the drying gas nozzle. An area in which the rinse agent flow Rf ejected from the rinse agent nozzle 20 collides with the surface WA of the substrate W is referred to as a "water-landing area Ra." As illustrated in FIG. 2A, actually, since the rinse agent R is already present in the water-landing area Ra, the rinse agent flow Rf ejected from the rinse agent nozzle 20 is to be mixed with the rinse agent R being already present on the surface WA of the substrate W, but the water-landing area Ra is assumed to refer to an area in which the rinse agent flow Rf collides with the surface WA of the substrate W without considering the rinse agent R being already present on the surface WA of the substrate W.

The drying gas nozzle 30 is a nozzle that supplies the IPA on the film of the rinse agent R covering the surface WA of the substrate W, and supplies the drying gas G pushing away the film of the rinse agent R to the substrate W in the gas flow (the drying gas flow Gf) state. Typically, the drying gas G is gas in which vapor of the IPA has been mixed with inert gas such as nitrogen or argon serving as carrier gas, but vapor of the IPA itself may be used as the drying gas G. The drying gas flow Gf is fine compared to the area size of the surface WA of the substrate W.

The substrate W to be processed has diameter of 200 mm to 450 mm. An inner diameter of the drying gas nozzle 30 that will form the drying gas flow Gf may be appropriately chosen from 3 mm to 10 mm, or 4 mm to 8 mm. The diameter of the drying gas nozzle 30 may be the same as or different from the diameter of the rinse agent nozzle 20. The diameter (the cross-sectional diameter of the drying gas flow Gf) of the drying gas flow Gf that is ejected from the drying gas nozzle 30 and collides with the surface WA of the substrate W is substantially the same as the inner diameter of the drying gas nozzle 30.

An area in which the drying gas flow Gf ejected from the drying gas nozzle 30 collides with the surface WA of the substrate W is referred to as a "gas-landing area Ga." As illustrated in FIG. 2B, since the drying gas G is already present in the gas-landing area Ga, the drying gas flow Gf spouted from the drying gas nozzle 30 is to be mixed with the drying gas G being already present in the surface WA of the substrate W, but the gas-landing area Ga is assumed to refer to an area in which the drying gas flow Gf collides with the surface WA of the substrate W without considering the drying gas G being already present in the surface WA of the substrate W.

The drying gas flow Gf is set to a thickness suitable for the single wafer IPA drying. Further, a relation between the water-landing area Ra of the rinse agent flow Rf and the gas-landing area Ga of the drying gas flow Gf is decided from a point of view in which the single wafer IPA drying can be appropriately performed. Typically, even when the rinse agent flow Rf and the drying gas flow Gf is moved, a state is maintained in which the drying gas flow Gf is located closer to the center side than the rinse agent flow Rf.

Figure 3A:
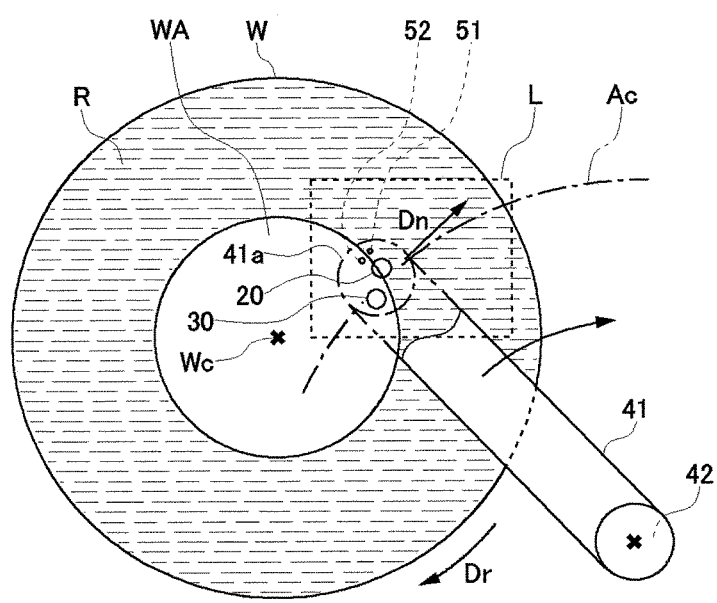
FIG. 3A is a plan view of a portion around a moving mechanism of a substrate drying apparatus according to an embodiment.
Figure 3B:
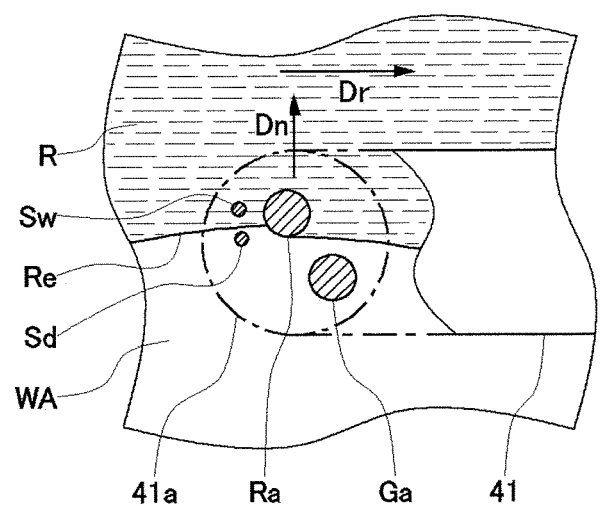
FIG. 3B is an enlarged plan view illustrating a leading edge portion of a movable arm of a moving mechanism according to an embodiment.

FIG. 3A is a plan view illustrating a portion around the moving mechanism of the substrate drying apparatus, and FIG. 3B is an enlarged plan view illustrating the leading edge portion of the movable arm of the moving mechanism. A direction (hereinafter, referred to as a "nozzle moving direction Dn") in which the arm leading edge 41a equipped with the rinse agent nozzle 20 and the drying gas nozzle 30 is moved will be described with reference to FIG. 3A. The nozzle moving direction Dn is a direction in which the arm leading edge 41a is moved, that is, a direction from the rotational center Wc of the substrate W to the outer circumference when the single wafer IPA drying is performed, that is, when the rinse agent R and the drying gas G is supplied to the surface WA of the substrate W.

As illustrated in FIG. 3A, the arm leading edge 41a is provided with a liquid area sensor 51 and a dried area sensor 52 in addition to the rinse agent nozzle 20 and the drying gas nozzle 30. In other words, the rinse agent nozzle 20, the drying gas nozzle 30, the liquid area sensor 51 and the dried area sensor 52 are installed on the same member, that is, the arm leading edge 41a, have a fixed relative positional relation, and move at the same time along with the movement of the arm leading edge 41a. The liquid area sensor 51 and the dried area sensor 52 are installed on the arm leading edge 41a and thus move away from the center of the substrate together with the rinse agent nozzle 20 and the drying gas nozzle 30. Each of the liquid area sensor 51 and the dried area sensor 52 performs sensing around the rinse edge on the surface WA of the substrate W.

FIG. 3B is an enlarged plan view illustrating the leading edge portion of the movable arm of the moving mechanism. FIG. 3B illustrates a sensing area Sw of the liquid area sensor 51 and a sensing area Sd of the dried area sensor 52 in addition to the water-landing area Ra and the gas-landing area Ga. As explicitly illustrated in FIG. 3B, the liquid area sensor 51 performs sensing outside a rinse edge Re of the rinse agent R to be formed on the surface WA of the substrate W through the rinse agent R and the drying gas G, and the dried area sensor 52 performs sensing inside the rinse edge Re of the rinse agent R.

Each of the liquid area sensor 51 and the dried area sensor 52 is a sensor that measures film pressure of the liquid film of the rinse agent R formed on the surface WA of the substrate W. As the liquid area sensor 51 and the dried area sensor 52, an arbitrary sensor capable of measuring a film thickness of a liquid film such as a laser type, an ultrasonic type, a contact type, or a capacitive type may be used.

Further, as illustrated in FIG. 3B, the gas-landing area Ga is positioned at an upstream side in the nozzle moving direction Dn compared with the water-landing area Ra, and a distance R52 between the gas-landing area Ga and the center Wc of the substrate W is smaller than a distance R51 between the water-landing area Ra and the center Wc of the substrate W. Further, the water-landing area Ra is at the upstream side compared with the gas-landing area Ga when viewed in the substrate rotation direction Dr. At this time, it is desirable to decide the water-landing area Ra and the gas-landing area Ga in a range in which an action of the drying gas G can be substantially exerted on at least the rinse agent R present in the water-landing area Ra while preventing the drying gas flow Gf from entering the water-landing area Ra.

Here, the range in which the action of the drying gas G can be substantially exerted on the rinse agent R is a range in which one of actions of the drying gas G of reducing the surface tension of the rinse agent R can be expected to be exerted (the single wafer IPA drying can be appropriately performed). Preferably, the action of reducing the surface tension of the rinse agent R is an action that is mainly exerted by the drying gas G that collides with the surface WA and thereafter is diffused from a point of view of preventing the rinse agent R spread by the centrifugal force with the rotation of the substrate W from flying off. The rinse agent nozzle 20 and the drying gas nozzle 30 are attached to the movable arm 41 so that the rinse agent flow Rf and the drying gas flow Gf can be supplied to the above-described position in relation to the substrate W.

Figure 4:
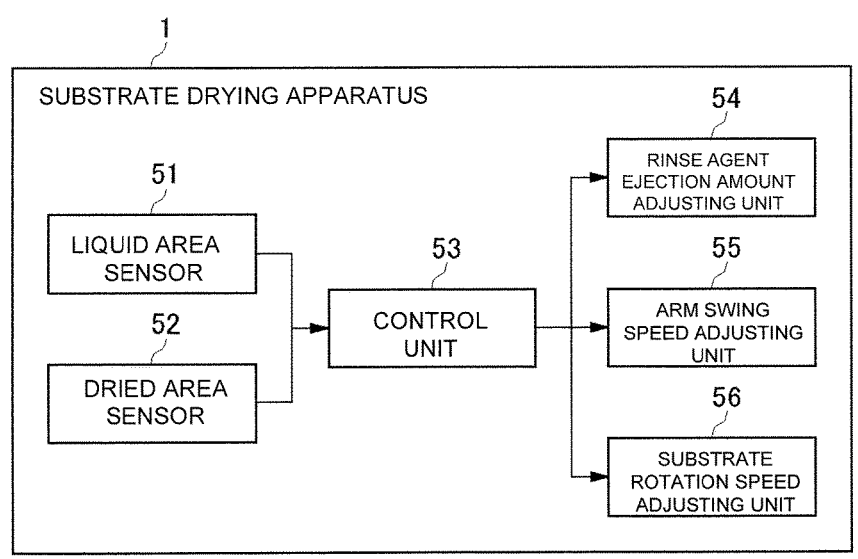
FIG. 4 is a block diagram illustrating a configuration of a control system of a substrate drying apparatus according to an embodiment.

FIG. 4 is a block diagram illustrating a configuration of a control system of the substrate drying apparatus. The substrate drying apparatus 1 includes the liquid area sensor 51, the dried area sensor 52, a control unit 53, a rinse agent ejection amount adjusting unit 54, an arm swing speed adjusting unit 55, and a substrate rotation speed adjusting unit 56. The liquid area sensor 51 and the dried area sensor 52 transmit a sensing result to the control unit 53. The control unit 53 is configured with a computer, and generates a control signal according to a control program based on the sensing results of the liquid area sensor 51 and the dried area sensor 52, and transmits the control signal to the rinse agent ejection amount adjusting unit 54, the arm swing speed adjusting unit 55, and the substrate rotation speed adjusting unit 56. The control program is stored in a storage medium in a non-transitory manner and provided.

The rinse agent ejection amount adjusting unit 54 adjusts a flow rate (an ejection amount) of the rinse agent flow Rf ejected from the rinse agent nozzle 20 according to the control signal transmitted from the control unit 53. The arm swing speed adjusting unit 55 is connected with the drive source 43 of the moving mechanism 40 through a signal cable, and adjusts the moving speed of the movable arm 41 by adjusting the rotation speed of the movable shaft 42 by the drive source 43 according to the control signal transmitted from the control unit 53. The substrate rotation speed adjusting unit 56 is connected with the rotary drive shaft 12 of the rotating mechanism 10 through a signal cable, and adjusts the rotation speed of the substrate W by adjusting the rotation speed of the rotary drive shaft 12 according to the control signal transmitted from the control unit 53. The flow rate of the rinse agent flow Rf, the moving speed of the movable arm 41, and the rotation speed of the substrate W correspond to the drying condition.

Figure 5:
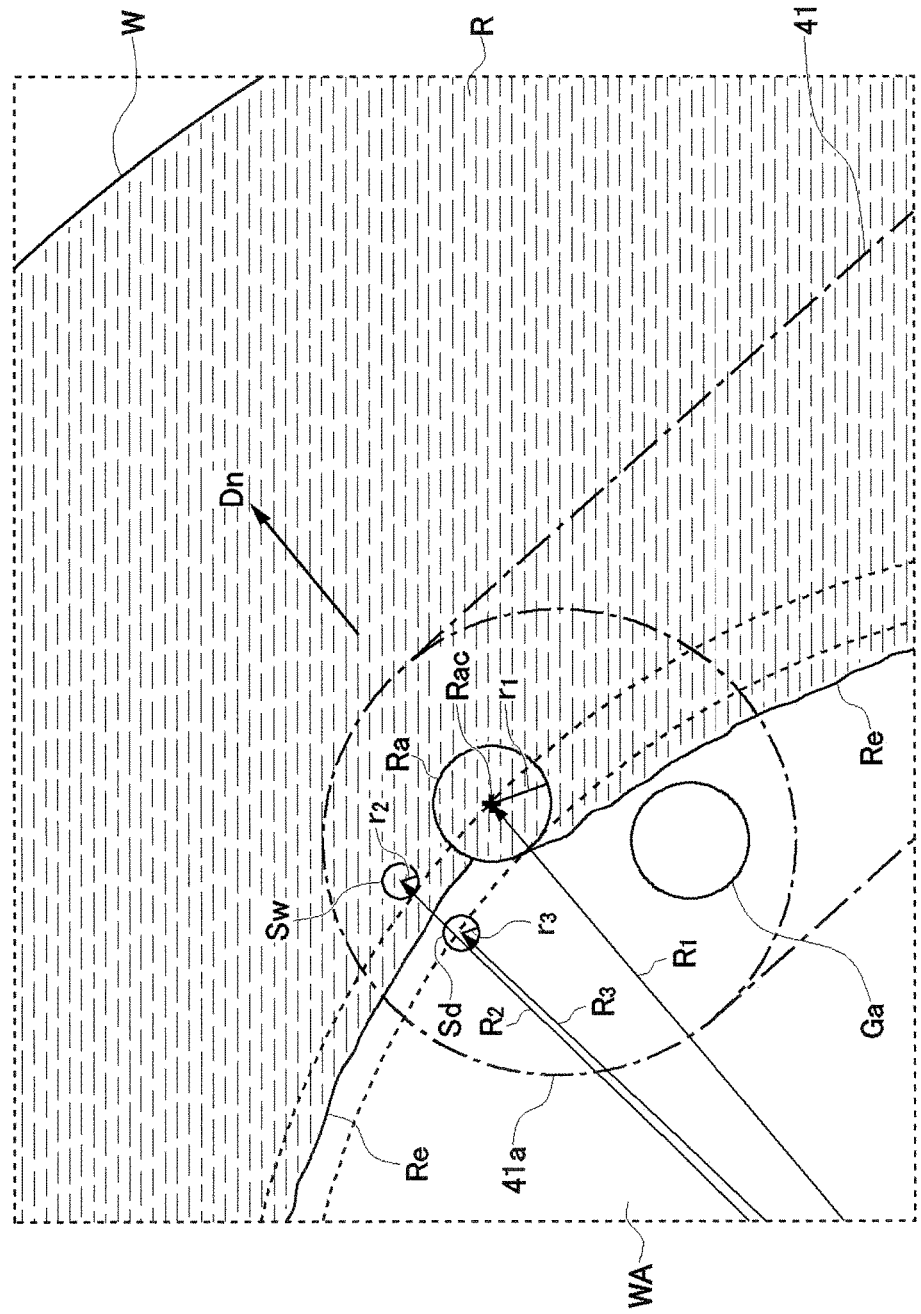
FIG. 5 is a diagram illustrating a positional relation among a rinse edge, a water-landing area, a gas-landing area, and each sensing area according to an embodiment.

FIG. 5 is an enlarged view of a portion L of FIG. 3 and illustrates a positional relation among the rinse edge, the water-landing area, the gas-landing area, and the sensing areas. FIG. 5 illustrates a state in which the rinse edge Re of the rinse agent R has an ideal shape. Hereinafter, the distance between a gravity center Rac of the water-landing area Ra, a gravity center of the sensing area Sw or a gravity center of the sensing area Sd and the center Wc of the substrate W is indicated by $R_1$, $R_2$ or $R_3$ respectively; the radius of the water-landing area Ra, the sensing area Sw or the sensing area Sd is indicated by $r_1$, $r_2$ or $r_3$ respectively. In the present embodiment, since the sensing areas Sw and Sd have a circular shape, the gravity centers of the sensing areas Sw and Sd are the centers. Further, in the following description, the inner side and the outer side are assumed to indicate a direction facing the center Wc of the substrate W and a direction from the center Wc of the substrate W to the outer circumference.

As illustrated in FIG. 5, a distance (that is, $R_2-r_2$) between the inner side end of the sensing area Sw and the center Wc of the substrate W is equal to the distance $R_1$ between the gravity center Rac of the water-landing area Ra and the center Wc of the substrate W, and the entire sensing area Sw overlaps the water-landing area Ra in the circumferential direction of the substrate W. Further, the distance $R_3$ between the center of the sensing area Sd and the center Wc of the substrate W is equal to the distance (that is, $R_1-r_1$) between the inner side end of the water-landing area Ra and the center Wc of the substrate W.

If the rinse agent nozzle 20, the liquid area sensor 51, and the dried area sensor 52 are arranged to satisfy the above condition, when the ideal rinse edge Re of the rinse agent R illustrated in FIG. 4 is formed, the liquid area sensor 51 detects the liquid film of the rinse agent R of a certain level of film pressure, and the dried area sensor 52 never detects the rinse agent R. When the liquid area sensor 51 detects a certain level of film pressure of a certain rinse agent R, and the dried area sensor 52 does not detect the rinse agent R, the control unit 53 determines that the ideal rinse edge Re of the rinse agent R is formed.

An operation of the substrate drying apparatus 1 will be described. In the following description, an operation of each member is controlled by the control unit 53. The substrate W that has been subjected to the CMP and the wet cleaning using a chemical solution or the like in the previous process is gripped by the chuck claws 11 of the substrate rotating mechanism 10. The wet cleaning process before the drying process may be performed on the same substrate rotating mechanism 10 as that used when the drying process is performed. When the substrate W that is subjected to the drying process is held on the substrate rotating mechanism 10, the movable arm 41 is moved until an ejection port of the rinse agent nozzle 20 reaches the position facing a portion slightly deviated from the rotational center Wc of the surface WA of the substrate W. At this time, the drying gas nozzle 30 is positioned in a place in which the rotational center Wc of the surface WA is located in the gas-landing area Ga, and the gravity center of the collision range is at an upstream side in the nozzle moving direction Dn compared with the rotational center Wc of the surface WA.

When the movable arm 41 is moved up to the above-described position, the rinse agent flow Rf is ejected from the rinse agent nozzle 20 so that the rinse agent R is supplied to the surface WA of the substrate W. When the rinse agent flow Rf starts to be supplied to the surface WA, the rotary drive shaft 12 is rotated, and thus the substrate W is rotated within a horizontal plane.

When the surface WA is covered with the rinse agent R, and the rotation speed of the substrate W is increased to a certain value, the drying gas flow Gf is supplied from the drying gas nozzle 30 to the surface WA. Even when the drying gas flow Gf starts to be supplied to the surface WA, the rinse agent flow Rf is continuously supplied to the surface WA. As the drying gas flow Gf is supplied to the surface WA, the rinse agent R in the portion to which the drying gas G is supplied is removed even around the rotational center Wc that is small in the centrifugal force working on the rinse agent R on the surface WA, and a dried area appears on the surface WA. When the drying gas flow Gf starts to be supplied to the surface WA, the movable arm 41 is moved in the nozzle moving direction Dn, and thus the water-landing area Ra and the gas-landing area Ga are moved in the nozzle moving direction Dn with respect to the surface WA. Before the movable arm 41 is operated, the drying gas nozzle 30 is positioned in a place in which the gravity center of the gas-landing area Ga is at an upstream side in the nozzle moving direction Dn compared with the rotational center Wc of the surface WA, and thus as the movable arm 41 is operated, the gravity center of the gas-landing area Ga passes through the rotational center Wc.

As the movable arm 41 is moved from the rotational center Wc to the outer circumference of the substrate W while the rinse agent flow Rf and the drying gas flow Gf are supplied to the surface WA, the border between the rinse agent R and the drying gas G is gradually spread in a concentric circle form, and the dried area on the surface WA is gradually enlarged. At this time, at the rinse edge Re, the drying gas G is sprayed to the rinse agent R, and thus the IPA in the drying gas G is dissolved in the rinse agent R, and the surface tension of the rinse agent R is lowered. Since a concentration of the IPA dissolved in the rinse agent R decreases as the distance increases from the contact position with the drying gas flow Gf, the surface tension of the rinse agent R has a gradient that is low at the upstream side in the nozzle moving direction Dn and high at the downstream side therein. Due to the surface tension gradient, the Marangoni force works, which pulls the rinse agent R from a portion of low surface tension to a portion of high surface tension.

Further, the centrifugal force is added, which pulls the rinse agent R from the rotational center Wc side to the outer circumference side of the substrate W by the rotation of the substrate W. The rinse agent R is appropriately removed from the surface WA by an interaction of these forces. According to the above-described single wafer IPA drying, it is possible to suppress the occurrence of a problem such as a watermark on the hydrophobic surface WA and perform the drying process effectively. Further, the above-described single wafer IPA drying is effective when the surface WA of the substrate W is hydrophobic but can be also applied to a hydrophilic surface.

When the movable arm 41 reaches the outer circumference of the substrate W, the supply of the rinse agent flow Rf and the drying gas flow Gf to the surface WA is stopped. At this time, the supply of the rinse agent flow Rf to the surface WA is first stopped, and the supply of the drying gas flow Gf is then stopped. Thereafter, the rotation speed of the substrate W is increased (increased to about 800 to 2000 rpm in the present embodiment), and the droplets remaining on the outer circumference end portion (edge portion) and the rear surface of the substrate W are removed by the centrifugal force. Then, the drying process ends, the rotation of the substrate W is stopped, and then the substrate W is discharged from the rotating mechanism 10.

Next, an example in which the rinse edge Re of the rinse agent R does not become an ideal state when the single wafer IPA drying is performed as described above and feedback control performed by the control unit 53 at that time will be described. As described above, the movable arm 41 is moved from the center Wc of the substrate W toward the outer circumference. At this time, the substrate W is rotated on the center Wc serving as the rotational center through the substrate rotating mechanism 10. Thus, the moving speed of the surface WA of the substrate W in the circumferential direction is gradually increased as it gets closer to the outer circumference of the substrate W, and the centrifugal force is also increased. As described above, the single wafer IPA drying is a method in which the rinse edge Re of the liquid film of the rinse agent R supplied to the surface WA of the substrate W is moved with gradually enlarging from the center Wc of the substrate W toward the outer circumference by the centrifugal force and Marangoni force, and thus the substrate W is gradually dried starting from the center Wc. Thus, it is important to appropriately control the rinse edge Re of the rinse agent R.

Figure 6:
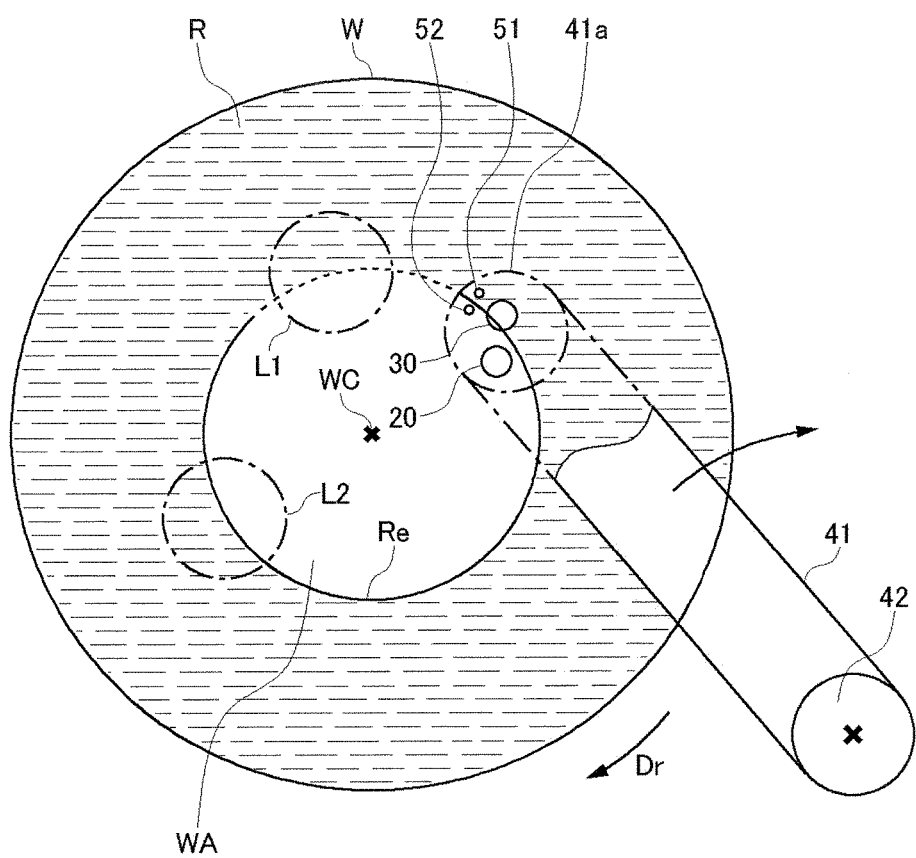
FIG. 6 is a diagram illustrating an example in which a rinse edge collapses according to an embodiment.
Figure 7A:
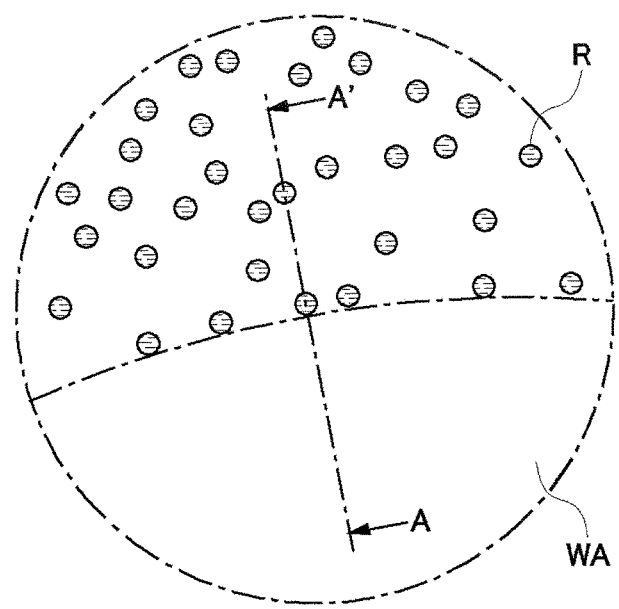
FIG. 7A is an enlarged view of an L1 portion of FIG. 6.
Figure 7B:
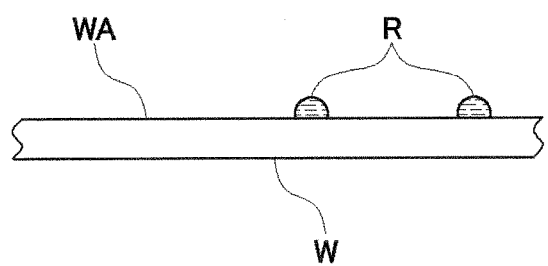
FIG. 7B is a cross-sectional view taken along line A-A' of FIG. 7A.
Figure 8A:
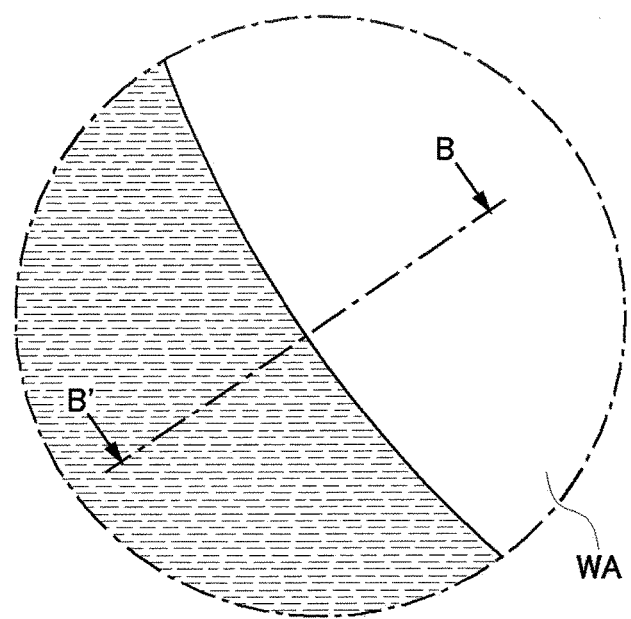
FIG. 8A is an enlarged view of an L2 portion of FIG. 6.
Figure 8B:
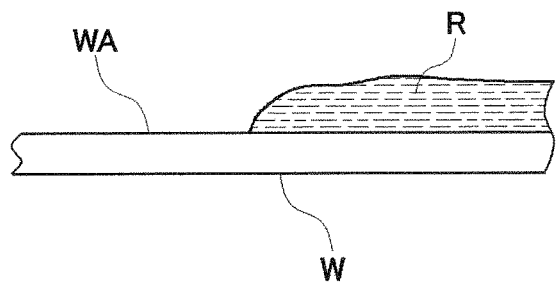
FIG. 8B is a cross-sectional view taken along line B-B' of FIG. 8A.

FIGS. 6 to 8 are diagrams illustrating an example in which the rinse edge Re of the rinse agent R collapses. As the distance between the arm leading edge 41a and the center Wc of the substrate W increases, the moving speed of the substrate W in the circumferential direction below the arm leading edge 41a increases, and an amount of the rinse agent R supplied per unit area of the surface WA of the substrate W decreases if an ejection amount of the rinse agent R from the rinse agent nozzle 20 is assumed to be constant. Further, as described above, the centrifugal force toward the outer circumference of the substrate W is also increased. Thus, as illustrated in FIGS. 6 and 7, at the upstream side of the substrate W in the rotation direction with respect to the arm leading edge 41a, there is a shortage of the rinse agent R, the liquid film of the rinse agent R gets thinner, the rinse edge Re collapses, and it is difficult to obtain the Marangoni effect in that area. When the rinse edge Re collapses, a liquid line that is directed toward the outer circumference of the substrate W is formed at the collapsed rinse edge Re, causing a watermark.

In the state such as FIGS. 6 and 7, the liquid area sensor 51 can merely detect an extremely thin liquid film thickness, can merely intermittently detect the liquid film, or cannot detect the liquid film at all. Upon receiving the sensing result of the liquid area sensor 51, the control unit 53 determines that a situation such as FIG. 6 has occurred based on the sensing result. In this case, the control unit 53 controls the rinse agent ejection amount adjusting unit 54 such that the ejection amount of the rinse agent R is increased and/or controls the substrate rotation speed adjusting unit 56 such that the rotation speed of the substrate W is decreased. When the ejection amount of the rinse agent R is increased, the sufficient rinse agent R is present even in the area in which the rinse edge Re is broken, and the rinse edge Re can be expected to be formed, and when the rotation speed of the substrate W is decreased, the centrifugal force gets weaker, and the liquid film thickness nearby the rinse edge Re can be expected to be held.

Figure 9:
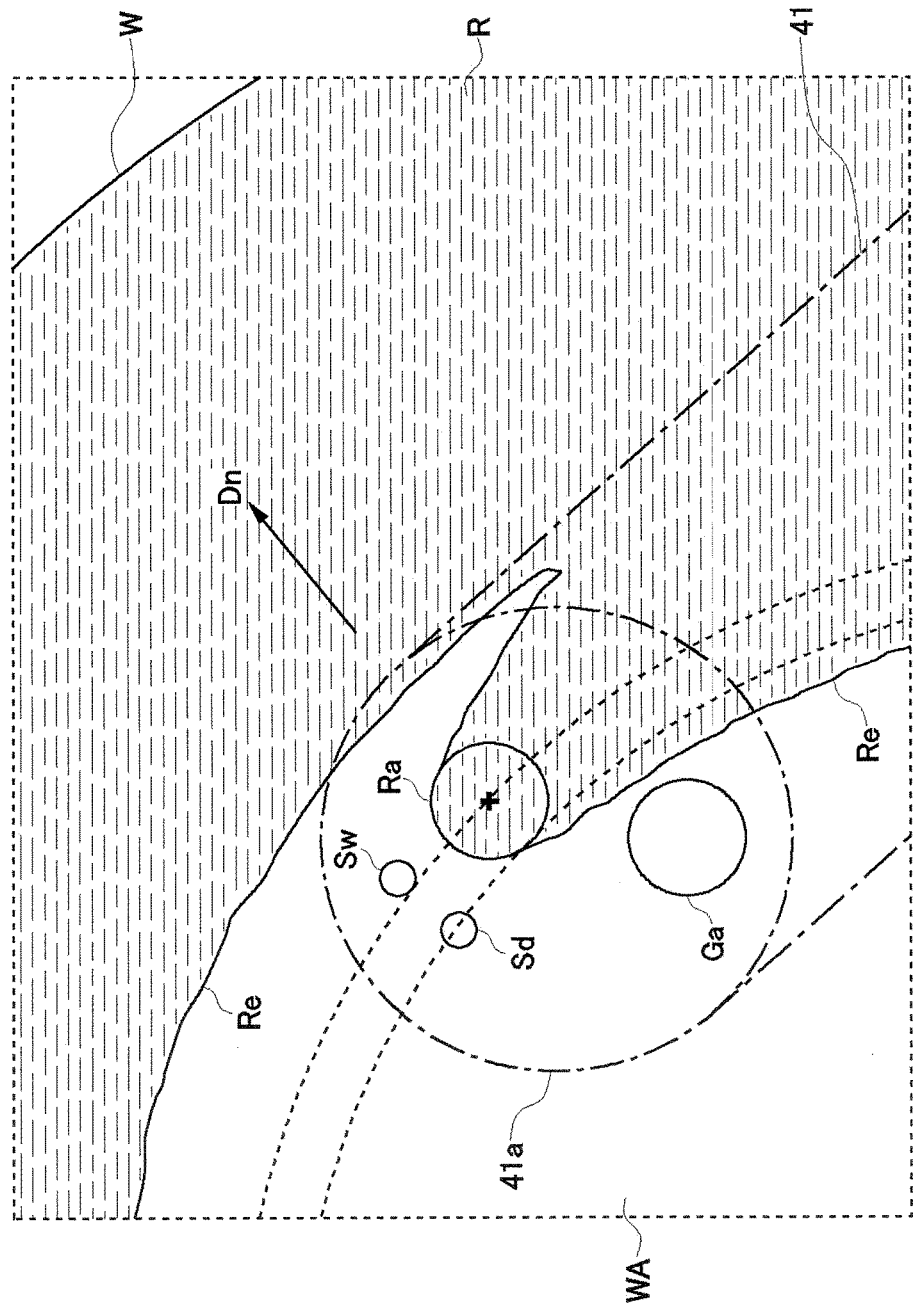
FIG. 9 is a diagram illustrating an example in which it is difficult to maintain a liquid film amount in a positional relation in which centrifugal force is strong, a speed is fast, but a liquid film is assumed to be thick due to friction with liquid space thereabove.

FIG. 9 is an enlarged view illustrating the portion L of FIG. 3 and illustrates an example in which the rinse edge Re of the rinse agent R overtakes the water-landing area Ra, and the rinse edge Re of the rinse agent R is broken below the arm leading edge 41a. First, the background in which the situation illustrated in FIG. 9 occurs will be described.

If the size of the substrate is increased from conventional 300 mm (diameter) to 450 mm (diameter) in the future, a portion (an outer circumference portion=radius 150 mm to 225 mm) at the outer side than the radius 150 mm is present, and in drying on a substrate surface placed flat, an angular speed unexperienced in a substrate of 300 mm works on the rinse agent on the substrate surface in the outer circumference portion. Thus, it may be difficult to maintain drying characteristics, particularly, in the outer circumference portion of the large-scaled substrate. It is inferred that the causes include a reduction in a liquid film thickness and a liquid film defect, resulting from increased centrifugal force, friction drying with air, and the like. Thus, in interface drying as in the single wafer IPA drying, liquid control for maintaining the interface is necessary.

If the rotation speed of the substrate W is too fast, the centrifugal force is increased, and as illustrated in FIG. 9, the rinse edge Re formed right after the rinse agent is ejected from the rinse agent nozzle 20 is moved too much toward the outer circumference while going round the substrate W, and when it returns to the arm leading edge 41a again, the rinse edge Re of the rinse agent R is moved outside the water-landing area Ra, and thus a break is formed.

In this state, the moving speed of the rinse edge of the rinse agent R toward the outer side of the substrate W is fast, the speed of the substrate W at the upstream side in the rotation direction with respect to the arm leading edge 41a is much faster than the speed of the substrate W at the downstream side in the rotation direction with respect to the arm leading edge 41a, and when it goes round by the rotation of the substrate W and it returns to the arm leading edge 41a again, the rinse edge Re of the rinse agent R is moved to the outer side than the outer side end of the water-landing area Ra. When a break is formed as described above, threefold rinse edges are formed at that position in the diameter direction as illustrated in FIG. 9, but since the drying gas flow Gf is not supplied to the two rinse edges at the outer side, unstable drying is performed.

In the state such as FIG. 9, the liquid area sensor 51 cannot detect the liquid film. Upon receiving the sensing result of the liquid area sensor 51, the control unit 53 determines that the situation such as FIG. 9 has occurred based on the sensing result. In this case, the control unit 53 controls the arm swing speed adjusting unit 55 such that the swing speed (rotation speed) of the arm 41 is increased and/or controls the substrate rotation speed adjusting unit 56 such that the rotation speed of the substrate W is reduced. If the swing speed of the arm 41 is increased, the water-landing area Ra overtakes the rinse edge Re of the rinse agent R at the upstream side compared with the arm leading edge 41*a*, and the rinse edge Re of the rinse agent R can be expected to be connected through the water-landing area Ra at the upstream and downstream sides of the arm leading edge 41*a*, and if the number of rotations of the substrate W is reduced, the centrifugal force gets weak, the moving speed of the rinse edge Re in the outer circumference direction is decreased, and the rinse edge Re of the rinse agent R can be expected to be connected through the water-landing area Ra at the upstream and downstream sides of the arm leading edge 41*a*.

Figure 10:
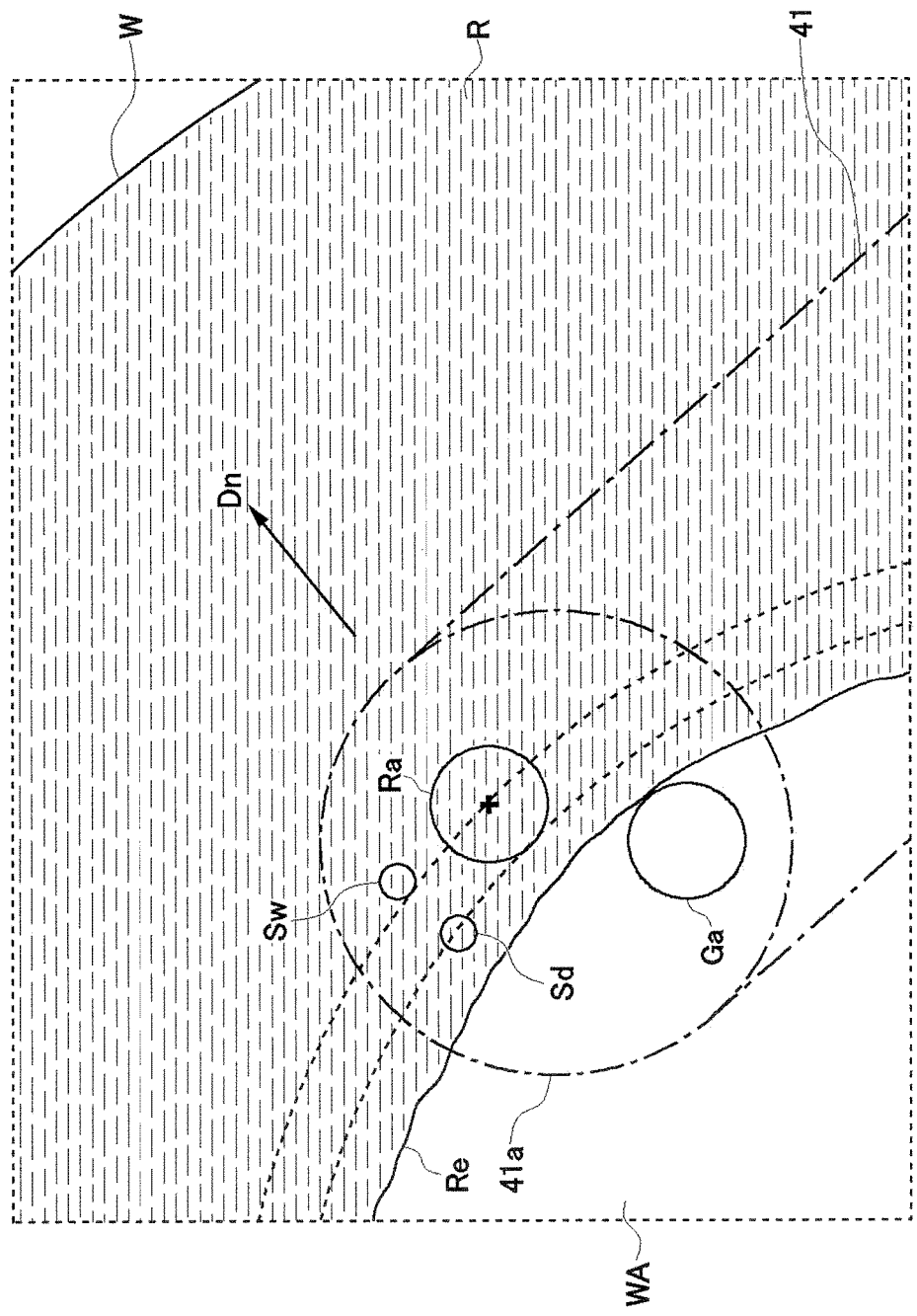
FIG. 10 is a diagram illustrating an example in which as a rotation speed of a substrate is increased or a liquid volume is increased too much in order to increase productivity, a new liquid edge overtakes a circling liquid edge.

FIG. 10 is an enlarged view illustrating the portion L of FIG. 3 and illustrates an example in which the water-landing area Ra overtakes the rinse edge Re of the rinse agent R, and the rinse edge Re of the rinse agent R is connected in the entire circumferential direction of the substrate W (directly connected at the upstream side and the downstream side of the water-landing area Ra). First, the background in which a situation illustrated in FIG. 10 occurs will be described.

In recent years, in order to increase the productivity, it is required to improve the throughput, and thus a short-time drying process is required in the single wafer IPA drying, too. In the single wafer IPA drying that dries the surface from the central portion to the outer circumference, it is necessary to accelerate a processing speed toward the outer circumference in order to shorten time taken for drying and then to increase the productivity. Particularly, since a next-generation substrate of 450 mm has 1.5 times as large diameter as a conventional substrate of 300 mm, even for at least obtaining the equivalent productivity as the substrate of 300 mm, in order to fix the time to dry the surface from the central portion to the outer circumference, it is necessary to accelerate the processing speed to be 1.5 times as fast.

When the swing speed of the arm 41 is increased too much in order to improve the productivity, the water-landing area Ra reaches beyond the rinse edge Re of the rinse agent R at the outer side as illustrated in FIG. 10. In this state, the rinse edge to be formed by the rinse agent R right after supplied from the rinse agent nozzle 20 is at the outer side than an actual rinse edge. This state can also occur when the rotation speed of the substrate W is too slow, and the centrifugal force is too small. When the situation gets worse, the rinse edge Re of the rinse agent R is formed at the inner side and reaches the gas-landing area Ga, and when the rinse edge Re of the rinse agent R goes beyond the gas-landing area Ga, it is difficult to spray the drying gas flow Gf to the rinse edge Re of the rinse agent R through the drying gas nozzle 30, and thus it is difficult to obtain the Marangoni effect at the rinse edge Re of the rinse agent R.

In the state illustrated in FIG. 10, the dried area sensor 52 detects the liquid film. Further, as a portent thereof, the dried area sensor 52 first detects the liquid film intermittently. Upon receiving the sensing result of the dried area sensor 52, the control unit 53 determines that the situation such as FIG. 10 has occurred or is likely to occur based on the sensing result. In this case, the control unit 53 controls the arm swing speed adjusting unit 55 such that the swing speed of the arm 41 is decreased and/or controls the substrate rotation speed adjusting unit 56 such that the rotation speed of the substrate W is decreased. When the swing speed of the arm 41 is decreased, the state in which the water-landing area Ra overtakes the rinse edge Re of the rinse agent R at the upstream side compared with the arm leading edge 41*a* can be expected to be improved, and when the number of rotations of the substrate W is decreased, the centrifugal force gets weak, the moving speed of the rinse edge Re in the outer circumferential direction is decreased, and thus the movement of the rinse edge Re of the rinse agent R in the outer circumferential direction can be expected to catch up with the movement of the arm leading edge 41*a* in the outer circumferential direction.

Figure 11:
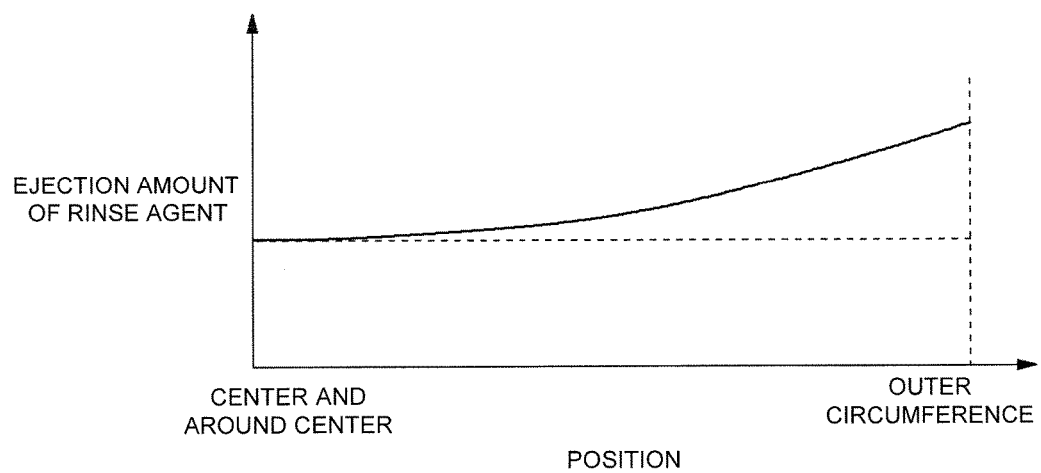
FIG. 11 is a graph illustrating a relation between an ejection amount of a rinse agent and a position of an arm leading edge in a radial direction of a substrate W according to an embodiment.

In the single wafer IPA drying of the substrate W, by controlling the drying condition, the ejection amount of the rinse agent R from the rinse agent nozzle 20 is increased as the rinse agent nozzle 20 moves toward the outer circumference of the substrate W. FIG. 11 is a graph illustrating a relation between the ejection amount of the rinse agent R and the position of the arm leading edge 41*a* in the radial direction of the substrate W. As illustrated in FIG. 11, the control unit 53 performs control such that the amount of the rinse agent R ejected from the rinse agent nozzle 20 as the rinse agent nozzle 20 moves toward the outer circumference of the substrate W.

Similarly, when the drying condition is controlled, there are cases in which the moving speed (the swing speed) of the rinse agent nozzle 20 toward the outer circumference is increased as the rinse agent nozzle 20 moves toward the outer circumference of the substrate W. In other words, the control unit 53 performs control such that the moving speed of the rinse agent nozzle 20 is increased as the rinse agent nozzle 20 moves toward the outer circumference of the substrate W. Further, there are cases in which the rotation speed of the substrate W is decreased as the rinse agent nozzle 20 moves toward the outer circumference of the substrate W. In other words, the control unit 53 performs control such that the rotation speed of the substrate W is decreased as the rinse agent nozzle 20 moves toward the outer circumference of the substrate W.

As described above, according to the substrate drying apparatus 1 of the present embodiment, as the rinse agent nozzle 20 and the drying gas nozzle 30 are moved away from the center of the substrate, the liquid area sensor 51 that senses the liquid film thickness slightly outside the rinse edge Re of the rinse agent R and the dried area sensor 52 that senses the liquid film thickness slightly inside the rinse edge Re of the rinse agent R are moved away from the center Wc of the substrate W, and thus it is possible to sense the state of the rinse edge Re of the rinse agent R that is spread toward the outer circumference on the surface WA of the substrate W. Further, the control unit 53 controls the drying condition based on the sensing result of the rinse edge Re of the rinse agent R, and thus it is possible to perform the single wafer IPA drying while keeping the rinse edge Re of the rinse agent R properly.

Further, in the above embodiment, the substrate drying apparatus 1 is equipped with the liquid area sensor 51 and the dried area sensor 52, detects the situations of FIGS. 6 to 10, and controls the drying condition, but the substrate drying apparatus may be equipped with any one of the sensors, detect any one of the situations of FIGS. 6 to 10, and control the drying condition to cope with the situation.

Further, in the above embodiment, all of the rinse agent nozzle 20, the drying gas nozzle 30, the liquid area sensor 51, and the dried area sensor 52 are installed on the arm leading edge 41*a*, and a relative positional relation thereamong is fixed, but each of them may move above the substrate W through independent moving mechanisms, respectively.

Further, for drying of one or more substrates W, logs of a control signal transmitted from the control unit 53 to the rinse agent ejection amount adjusting unit 54 or the like, that is, logs of the drying condition may be stored, and a recipe may be created based on the logs. The control unit 53 can perform an excellent single wafer IPA drying according to the recipe created as described above without the feedback of the liquid area sensor 51 or the dried area sensor 52. For example, the control unit 53 performs control such that the amount of the rinse agent R ejected from the rinse agent nozzle 20 is increased as the rinse agent nozzle 20 moves toward the outer circumference of the substrate W, performs control such that the moving speed of the rinse agent nozzle 20 is increased as the rinse agent nozzle 20 moves toward the outer circumference of the substrate W, and/or performs control such that the rotation speed of the substrate W is decreased as the rinse agent nozzle 20 moves toward the outer circumference of the substrate W.

Figure 12A:
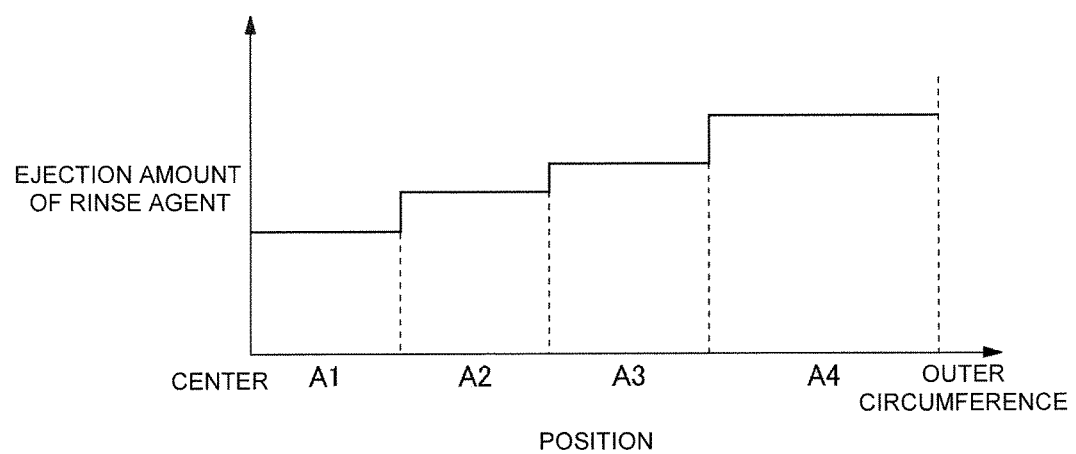
FIG. 12A is a graph illustrating a relation between an ejection amount of a rinse agent and a position of an arm leading edge in a radial direction of a substrate according to a modified example of an embodiment.
Figure 12B:
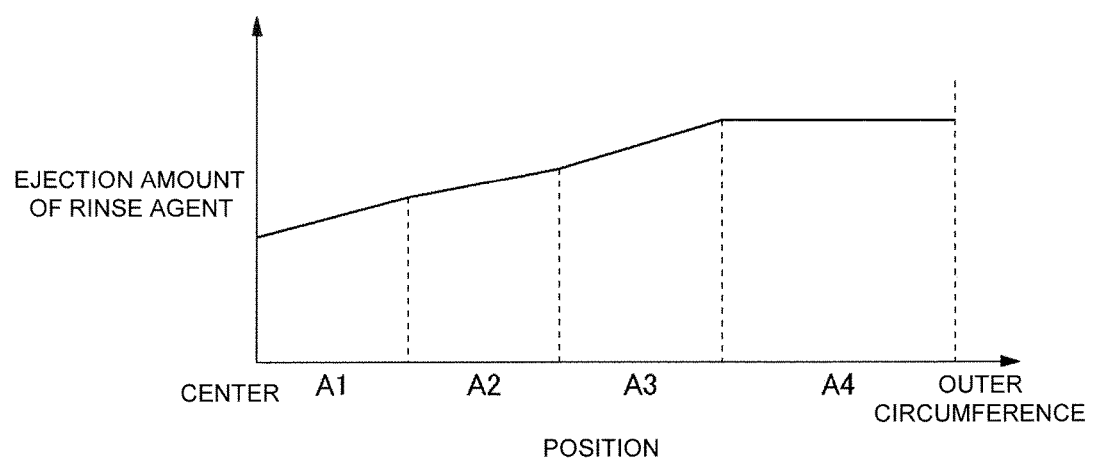
FIG. 12B is a graph illustrating a relation between an ejection amount of a rinse agent and a position of an arm leading edge in a radial direction of a substrate according to a modified example of an embodiment.

When the recipe is created, the position of the arm leading edge 41a in the radial direction of the substrate W may be divided into a plurality of areas, and the drying condition of each area may be set to be constant. FIG. 12A is a graph illustrating a relation between the ejection amount of the rinse agent R and the position of the arm leading edge 41a in the radial direction of the substrate W. In this example, the control unit 53 divides the position of the arm leading edge 41a in the radial direction of the substrate W into four areas A1 to A4, sets the drying condition of each area to be constant, and controls the ejection amount of the rinse agent R such that the ejection amount of the rinse agent R is increased stepwise as it gets closer to the outer circumference. Similarly, FIG. 12B is a graph illustrating a relation between the ejection amount of the rinse agent R and the position of the arm leading edge 41a in the radial direction of the substrate W, and in this example, the control unit 53 controls the ejection amount of the rinse agent R such that the ejection amount of the rinse agent R is continuously increased in the areas A1 to A4.

Further, when the control unit 53 performs control according to the recipe, the operations of the liquid area sensor 51 and the dried area sensor 52 and the control unit 53 described in the above embodiment may be used as an interlock.

Further, the positions of the sensing area Sw of the liquid area sensor 51 and the sensing area Sd of the dried area sensor 52 are not limited to the position described in the above embodiment. A condition required for the liquid area sensor 51 to detect the state in which the rinse edge Re of the rinse agent R is broken as illustrated in FIGS. 6 and 7 is a condition in which the entire sensing area Sw overlaps the water-landing area Ra in the circumferential direction of the substrate W, that is, to satisfy $R_2+r_2<R_1+r_1$. Further, a condition required for the dried area sensor 52 to detect the state in which the rinse edge Re of the rinse agent R is continued in the entire circumferential direction of the substrate W without involving the water-landing area Ra as illustrated in FIG. 9 is a condition in which at least a part of the sensing area Sd overlaps the water-landing area Ra in the circumferential direction of the substrate W, that is, to satisfy $R_3+r_3>R_1-r_1$. In view of the conditions, a desirable condition is to satisfy $R_3+r_3<R_2+r_2<R_1+r_1$ and $R_1-r_1>R_3$.

Further, the control unit 53 determines whether the situation in which the liquid film is not detected by the liquid area sensor 51 is that of FIG. 5 or that of FIG. 6 based on the number of rotations of the substrate W, the swing speed of the arm 41, the position of the arm leading edge 41a, or the like at that time.

Further, in the above embodiment, the control unit 53 is described to control the rinse agent ejection amount adjusting unit 54 such that the ejection amount of the rinse agent R is increased and/or to control the substrate rotation speed adjusting unit 56 such that the rotation speed of the substrate W is decreased as the countermeasure for the situation of FIG. 5, the control unit 53 is described to control the arm swing speed adjusting unit 55 such that the swing speed (the rotation speed) of the arm 41 is increased and/or to control the substrate rotation speed adjusting unit 56 such that the rotation speed of the substrate W is decreased as the countermeasure for the situation of FIG. 6, and the control unit 53 is described to control the arm swing speed adjusting unit 55 such that the moving speed of the arm 41 is decreased and/or to control the substrate rotation speed adjusting unit 56 such that the rotation speed of the substrate W is decreased as the countermeasure for the situation of FIG. 9, and the substrate drying apparatus may not be equipped with any one of the rinse agent ejection amount adjusting unit 54, the arm swing speed adjusting unit 55, and the substrate rotation speed adjusting unit 56. Further, any one of the rinse agent ejection amount adjusting unit 54, the arm swing speed adjusting unit 55, and the substrate rotation speed adjusting unit 56 may control the flow rate of the rinse agent R, the moving speed of the arm 41, and the rotation speed of the substrate W according to a certain set value (a recipe) regardless of the sensing result of the liquid area sensor 51 or the dried area sensor 52.

Further, in the above embodiment, in the single wafer IPA drying, in order to control the rinse edge of the rinse agent moving toward the outer circumference, the substrate drying apparatus 1 is equipped with the rinse agent ejection amount adjusting unit 54, the arm swing speed adjusting unit 55, and the substrate rotation speed adjusting unit 56, and adjusts the ejection amount of the rinse agent, the swing speed of the arm, and/or the rotation speed of the substrate according to the control of the control unit 53 based on the sensing results of the liquid area sensor 51 and the dried area sensor 52. Instead of or in addition to the rinse agent ejection amount adjusting unit 54, the arm swing speed adjusting unit 55, and the substrate rotation speed adjusting unit 56, the substrate drying apparatus 1 may be equipped with the drying gas concentration adjusting unit and a drying gas flow rate adjusting unit. In other words, the "drying condition" conceptually includes the IPA concentration and the flow rate of the drying gas in addition to the ejection amount of the rinse agent, the swing speed of the arm, and/or the rotation speed of the substrate.

The drying gas concentration adjusting unit adjusts the IPA concentration in the drying gas G spouted from the drying gas nozzle 30 according to the control signal transmitted from the control unit 53. Further, the drying gas flow rate adjusting unit adjusts the flow rate (the spouted amount) of the drying gas flow Gf spouted from the drying gas nozzle 30 according to the control signal transmitted from the control unit 53. Further, as a technique of adjusting the IPA concentration in the drying gas, for example, a technique disclosed in JP 2011-192967 A may be employed.

For example, when the liquid film of the rinse agent is too thick, the control unit 53 can control the drying gas flow rate adjusting unit such that the flow rate is lowered. In this case, the control unit 53 decreases the flow rate of the drying gas flow Gf, increases the rotations of the substrate, and reduces the thickness of the liquid film by stretching the rinse agent by the centrifugal force. Further, the IPA has an effect of reducing the surface tension, and may be used to feed back the liquid film. Furthermore, when the liquid film of the rinse agent is too thick, it is also possible to reduce the film thickness right after the edge is formed by increasing the IPA concentration in the drying gas G.

What is claimed is:

1. A substrate drying apparatus, comprising:
a substrate rotating mechanism configured to rotate a substrate within a horizontal plane;
a rinse agent nozzle configured to eject a rinse agent to the substrate while moving away from a center of the substrate relative to the substrate rotated by the substrate rotating mechanism;
an IPA gas nozzle configured to spout an IPA gas to the substrate while moving away from the center of substrate relative to the substrate rotated by the substrate rotating mechanism with movement of the rinse agent nozzle;
a liquid area sensor mounted on an arm and a dried area sensor mounted on the arm, the sensors respectively configured to sense a film thickness of a liquid film on a surface of the substrate at two places around an interface of the rinse agent by moving away from the center of the substrate with movement of the rinse agent nozzle and the IPA gas nozzle while a rinse agent flow from the rinse agent nozzle and an IPA gas flow from the IPA gas nozzle are supplied to the surface; and
a control unit configured to control drying conditions comprising a rinse agent ejection amount, an arm swing speed, and a substrate rotation speed based on a sensing result of the liquid area sensor and the dried area sensor such that the interface of the rinse agent is spread on the surface of the substrate toward an outer circumference of the substrate by the rinse agent and the drying gas,
wherein the rinse agent nozzle and the IPA gas nozzle are arranged such that the landing area of the rinse agent is on the upstream side compared with the landing area of the IPA gas when viewed in the rotation direction of the substrate.

2. The substrate drying apparatus according to claim 1, wherein the liquid area sensor is configured to sense an outer side of the interface of the rinse agent.

3. The substrate drying apparatus according to claim 1, wherein the dried area sensor is configured to sense an inner side of the interface of the rinse agent.

4. The substrate drying apparatus according to claim 1, wherein the liquid area sensor is configured to sense an outer side of the interface of the rinse agent and the dried area sensor is configured to sense an inner side of the interface of the rinse agent.

5. The substrate drying apparatus according to claim 2, wherein the liquid area sensor is moved with movement of the rinse agent nozzle and the IPA gas nozzle so that a distance between a gravity center of a water-landing area of the rinse agent ejected from the rinse agent nozzle on the surface of the substrate and the center of the substrate is substantially equal to a distance between an innermost of a sensing area of the liquid area sensor in the surface of the substrate and the center of the substrate.

6. The substrate drying apparatus according to claim 3, wherein the dried area sensor is moved with movement of the rinse agent nozzle and the IPA gas nozzle so that a distance between an innermost of a water-landing area of the rinse agent ejected from the rinse agent nozzle on the surface of the substrate and the center of the substrate is substantially equal to a distance between a gravity center of a sensing area of the dried area sensor in the surface of the substrate and the center of the substrate.

7. The substrate drying apparatus according to claim 2, wherein a relative positional relation between the rinse agent nozzle and the liquid area sensor is fixed.

8. The substrate drying apparatus according to claim 3 or 4,
wherein a relative positional relation between the rinse agent nozzle and the dried area sensor is fixed.

9. The substrate drying apparatus according to claim 1, wherein the drying condition includes an ejection amount of the rinse agent from the rinse agent nozzle.

10. The substrate drying apparatus according to claim 1, wherein the drying condition includes a moving speed of the rinse agent nozzle.

11. The substrate drying apparatus according to claim 1, wherein the drying condition includes a rotation speed of the substrate.

12. The substrate drying apparatus according to claim 1, wherein the rinse agent nozzle, the IPA gas nozzle, the liquid area sensor, and the dried area sensor are each located on the leading edge of the arm.

13. The substrate drying apparatus according to claim 1, wherein the dried area sensor is a non-contact sensor.

14. The substrate drying apparatus according to claim 13, wherein the dried area sensor is one of a laser sensor, an ultrasonic sensor, and a capacitive sensor.

15. A substrate drying apparatus, comprising:
a substrate rotating mechanism configured to rotate a substrate within a horizontal plane;
a rinse agent nozzle configured to eject a rinse agent to the substrate while moving away from a center of the substrate relative to the substrate rotated by the substrate rotating mechanism;
an IPA gas nozzle configured to spout an IPA gas to the substrate while moving away from the center of substrate relative to the substrate rotated by the substrate rotating mechanism with movement of the rinse agent nozzle;
a liquid area sensor mounted on an arm and a dried area sensor mounted on the arm, the sensors respectively configured to sense a film thickness of a liquid film on a surface of the substrate at two places while moving together with the rinse agent nozzle while a rinse agent flow from the rinse agent nozzle and an IPA gas flow from the IPA gas nozzle are supplied to the surface; and
a control unit configured to control drying conditions comprising a rinse agent ejection amount, an arm swing speed, and a substrate rotation speed based on a sensing result of the sensors,
wherein the rinse agent nozzle and the IPA gas nozzle are arranged such that the landing area of the rinse agent is on the upstream side compared with the landing area of the IPA gas when viewed in the rotation direction of the substrate.

* * * * *